(12) United States Patent
Karlquist

(10) Patent No.: US 6,831,491 B2
(45) Date of Patent: Dec. 14, 2004

(54) SYSTEMS AND METHODS FOR CORRECTING PHASE LOCKED LOOP TRACKING ERROR USING FEED-FORWARD PHASE MODULATION

(75) Inventor: Richard K. Karlquist, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/328,358

(22) Filed: Dec. 23, 2002

(65) Prior Publication Data

US 2004/0119514 A1 Jun. 24, 2004

(51) Int. Cl.$^7$ ................................................ H03L 7/06
(52) U.S. Cl. ................... 327/156; 327/163; 327/147; 375/376
(58) Field of Search .......................... 327/105, 113, 327/114, 141, 146, 147, 162, 154–156, 163–165, 291, 294, 299; 375/375, 376; 331/1 R, 1 A, 14, 17, 18, 23, 25; 455/257–260, 262–264

(56) References Cited

U.S. PATENT DOCUMENTS

| | | | | |
|---|---|---|---|---|
| 4,688,003 A | * | 8/1987 | Stromswold | 331/25 |
| 5,081,427 A | * | 1/1992 | Suarez | 331/10 |
| 5,307,006 A | * | 4/1994 | Rankin et al. | 323/313 |
| 5,353,311 A | * | 10/1994 | Hirata et al. | 375/135 |
| 5,604,468 A | * | 2/1997 | Gillig | 331/176 |
| 5,764,704 A | * | 6/1998 | Shenoi | 375/324 |
| 5,995,552 A | * | 11/1999 | Moriyama | 375/271 |
| 6,018,275 A | * | 1/2000 | Perrett et al. | 332/127 |
| 6,097,560 A | * | 8/2000 | Tanaka et al. | 360/51 |
| 6,208,216 B1 | * | 3/2001 | Nasila | 332/110 |
| 6,232,911 B1 | * | 5/2001 | O'Conner | 342/128 |
| 6,249,189 B1 | * | 6/2001 | Wu et al. | 331/18 |
| 6,549,562 B1 | * | 4/2003 | Olaker et al. | 375/139 |

OTHER PUBLICATIONS

U.S. Appl. No. 10/328,304, Karlquist.
U.S. Appl. No. 10/328,363, Karlquist.
U.S. Appl. No. 10/328,298, Karlquist.
Armstrong, Edwin H, "A Method of Reducing Disturbances in Radio Signaling by a System of Frequency Modulation", Proc. IRE, vol. 24, No. 5, May 1936, p. 689ff.
Jaffe, D.L., "Armstrong's Frequency Modulator", Proc. IRE, vol. 26, No. 4, Apr. 1938, p. 475ff.

* cited by examiner

Primary Examiner—Timothy P. Callahan
Assistant Examiner—Hai L. Nguyen

(57) ABSTRACT

Tracking error in phase locked loop (PLL) devices is addressed utilizing feed-forward phase modulation. Specifically, the phase difference of the reference signal and said oscillator signal of a PLL may be determined utilizing a phase detector. The output of the phase detector may be provided to a loop filter to provide feedback to the VCO of the PLL. Additionally, the filtered phase difference may be provided to a suitably calibrated phase modulator to add an amount of phase modulation to the oscillator signal that is approximately equal and opposite to said phase difference to generate a corrected phase output signal.

22 Claims, 8 Drawing Sheets

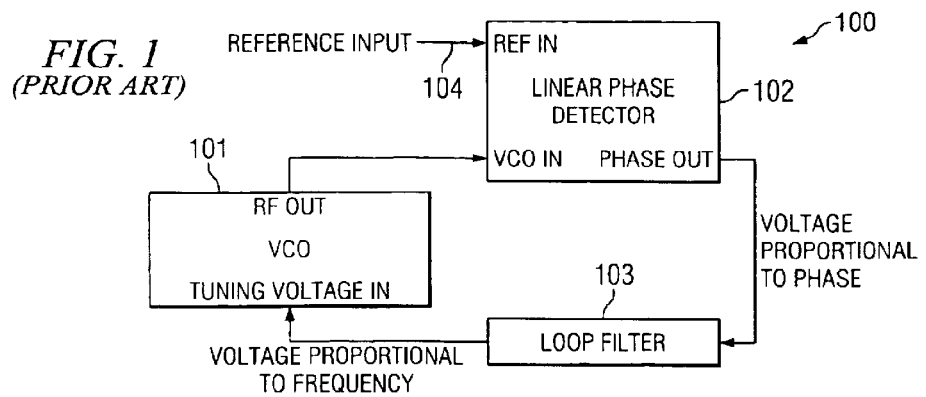
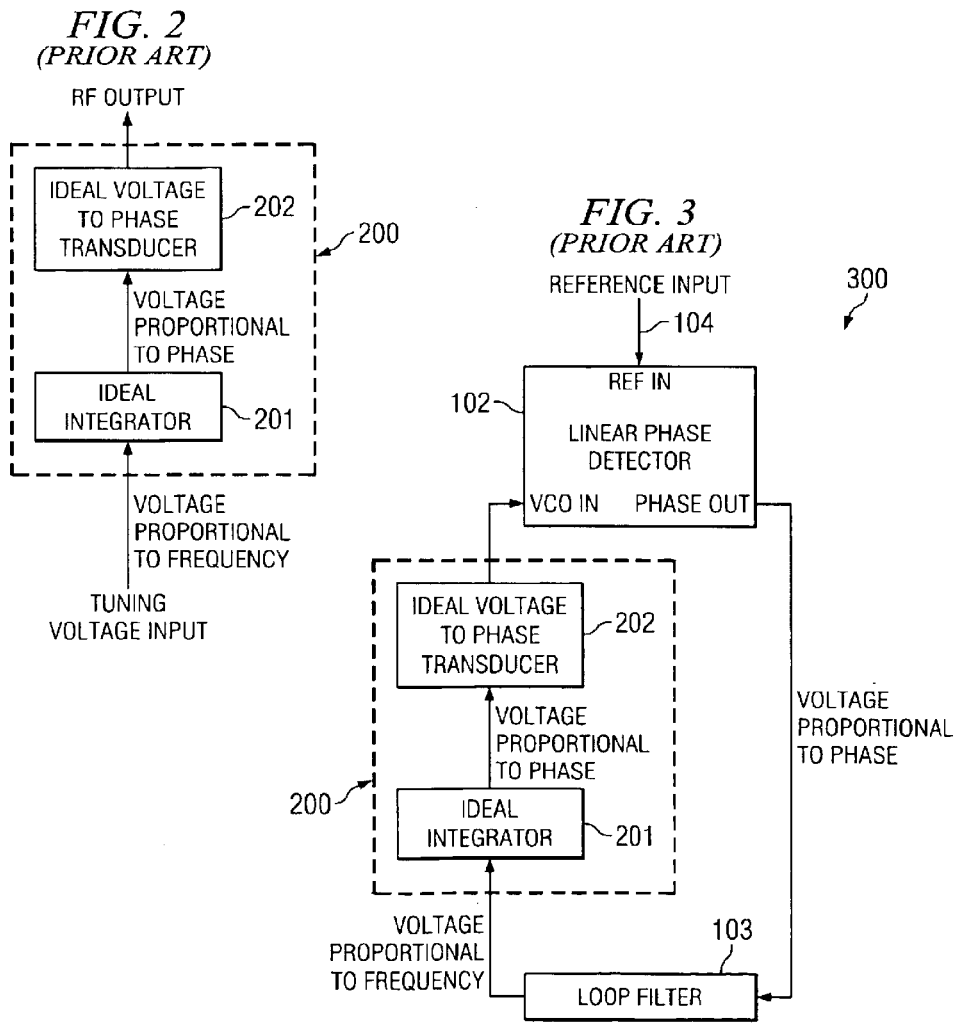

SYSTEMS AND METHODS FOR CORRECTING PHASE LOCKED LOOP TRACKING ERROR USING FEED-FORWARD PHASE MODULATION

RELATED REFERENCES

The present application is related to concurrently filed, co-pending, and commonly assigned U.S. patent application Ser. No. 10/328,298, entitled "SYSTEMS AND METHODS FOR CORRECTING GAIN ERROR DUE TO TRANSITION DENSITY VARIATION IN CLOCK RECOVERY SYSTEMS;" U.S. patent application Ser. No. 10/328,304, entitled "SYSTEM AND METHOD FOR DESIGNING AND USING ANALOG CIRCUITS OPERATING IN THE MODULATION DOMAIN;" and U.S. patent application Ser. No. 10/328,363, entitled "PHASE LOCKED LOOP DEMODULATOR AND DEMODULATION METHOD USING FEED-FORWARD TRACKING ERROR COMPENSATION;" the disclosures of which are hereby incorporated herein by reference.

TECHNICAL FIELD

The present invention is generally related to phase lock loop (PLL) devices and more particularly to systems and methods for addressing tracking error utilizing feed-forward phase modulation.

BACKGROUND OF THE INVENTION

Phase locked loops (PLLs) are devices that generate a signal and that lock the phase of the generated signal to the phase of an input reference signal. According to the prior art, as shown in FIG. 1, PLL 100 typically has three main components: voltage-controlled oscillator (VCO) 101, phase detector 102, and loop filter 103. VCO 101 generates a signal that has a frequency proportional to the tuning voltage input. This proportionality is typically expressed as a VCO gain parameter ($K_v$) denoted in units of radians/second per volt. Reference signal 104 may be provided at a reference frequency and phase. Phase detector 102 generates an output voltage proportional to the phase difference between the reference signal and the VCO signal. This proportionality is typically expressed as a phase detection gain parameter ($K_d$) denoted in units of volts/radian. Thus, phase detector 102 generates a phase error signal (i.e., the phase tracking error). Loop filter 103 amplifies and filters this error signal, which is then fed back to VCO 101. This feedback adjusts the phase of VCO 101 and causes VCO 101 to approximate the phase of the reference signal thereby minimizing the error.

PLL 100 as shown in FIG. 1 is difficult to analyze on a mathematical basis, because the input and output of the loop filter are different types of variables (i.e., voltage proportional to phase and voltage proportional to frequency, respectively). By definition, phase is the time integral of frequency. Therefore, an ideal VCO 200 may be modeled as two mathematical blocks: ideal integrator 201 and ideal voltage to phase transducer 202 as shown in FIG. 2 according to the prior art. Ideal VCO 200 may be incorporated in a PLL system to provide useable PLL model 300 as shown in FIG. 3 according to the prior art. PLL model 300 may then be analyzed according to mathematical model 400 shown in FIG. 4 according to the prior art. In mathematical model 400, $K_d$ represents the phase detection gain parameter of phase detector 102, F(s) represents the transfer function of loop filter 103 (expressed in Laplace transform notation), 1/s represents the transfer function of ideal integrator 201 (also expressed in Laplace transform notation), and $K_v$ represents the VCO gain parameter of VCO 101. The loop gain is represented by the parameter G which equals $K_d K_v F(s)/s$. Moreover, $\theta_{vco}$ represents the phase of the signal produced by VCO 101 and $\theta_{ref}$ represents the phase of the reference signal. The relationship between $\theta_{vco}$ and $\theta_{ref}$ may be represented by the following equation: $\theta_{vco/\theta ref}=G/(1+G)$. Thus, when the loop gain is relatively large (G>>1), $\theta_{vco}$ approximates $\theta_{ref}$ with a significant degree of accuracy.

Integrator 201 acts as a low pass filter and causes the loop gain to decrease with increasing frequency. Thus, tracking error increases with increasing frequency. At some frequency, the loop gain falls below unity. Above this frequency (which defines the loop bandwidth), the loop has relatively little response to the reference stimulus and, hence, limits the capacity of PLL 100 to continue accurately tracking the reference signal. Accordingly, this places a constraint upon the bandwidth of modulation that may be applied to the reference signal. Theoretically, the loop bandwidth can be increased by increasing the loop gain. However, in practice, implementations of VCO 101 have finite modulation bandwidth. The limited bandwidth of VCO 101 may be modeled in VCO 500 as a parasitic low pass filter 501 defined by transfer function P(s) as shown in FIG. 5 according to the prior art. This has the effect of modifying the mathematical model by adding another low pass function to loop model 600 as shown in FIG. 6 according to the prior art. As shown in FIG. 6, the loop gain (G) equals $K_d K_v F(s) P(s)/s$. This has the practical effect of limiting the loop bandwidth to a relatively small fraction of the VCO bandwidth. Because of numerous design constraints associated with implementations of VCO 101, the VCO bandwidth cannot be made arbitrarily high. Accordingly, the VCO bandwidth often becomes a limiting factor on loop bandwidth. In addition to the VCO bandwidth, the loop filter may have its own bandwidth limitations, especially if it utilizes active circuitry. The effect of finite loop filter bandwidth is the same as VCO bandwidth in terms of limiting loop bandwidth.

PLLs are commonly utilized to build frequency or phase demodulators. A demodulator is a system driven by a modulated signal that produces an output voltage that is proportional to the modulation. FIG. 7 depicts PLL frequency demodulator 700 according to the prior art. VCO 101 tracks the phase of the reference signal. Because of the close mathematical relationship between phase and frequency, VCO 101 also tracks the frequency of the reference. Since the tuning voltage applied to VCO 101 is proportional to the VCO frequency (and, hence, to the reference frequency), the tuning voltage is used directly as demodulated output 701.

FIG. 8 depicts phase demodulator 800 according to the prior art. Phase demodulator 800 is substantially the same as frequency demodulator 700 except that leaky integrator 801 has been added to convert the tuning voltage (proportional to frequency) into a voltage (demodulated output 802) proportional to phase. Since an ideal integrator is not physically realizable, a so-called "leaky" integrator 801 is shown. Specifically, leaky integrator 801 approximately acts as an ideal integrator above a specified minimum frequency ($\omega_1$). Below that frequency, leaky integrator 801 changes to a flat gain versus frequency characteristic. This imparts a low frequency cutoff to the frequency response of the demodulation output port.

BRIEF SUMMARY OF THE INVENTION

Embodiments in accordance with the invention adapt PLL devices to compensate for the tracking error of these devices. As previously mentioned, tracking error is the difference in the phase of the reference signal and the phase of the VCO signal. It shall be appreciated that addressing the tracking error of a PLL device with known techniques may be problematic for a number of factors. For example, VCOs are typically are non-linear frequency dependent devices. Accordingly, if the PLL device is incorporated into a system that is intended to be frequency-agile, tracking error compensation may become difficult. Moreover, the non-linearity and frequency dependence of VCOs generally have temperature-dependent gain drift as well thereby further complicating or prohibiting tracking error correction using known techniques for certain applications.

Embodiments in accordance with the invention address the tracking error of a PLL device without imposing a critical dependence on the vagaries of the VCO of the PLL device. Embodiments in accordance with the invention model the tracking error as a spurious phase modulation of the VCO signal. Accordingly, embodiments in accordance with the invention employ a phase modulator to correct the tracking error. The output of the phase detector is provided to the phase modulator to modulate the phase of the VCO signal. The phase and the gain of the phase modulator are calibrated such that approximately equal and opposite compensating phase modulation is added to the VCO signal. Addressing the tracking error in this manner is advantageous, because the accuracy associated with the method is determined by the accuracy of the phase detector and the phase modulator. Specifically, the characteristics of phase detectors and phase modulators are substantially improved as compared to the characteristics of VCOs. For example, many phase detectors have linear gain and have a flat frequency response to modulation. Digital phase detectors tend to have these characteristics inherently. Moreover, accurate phase modulators (e.g., the Armstrong phase modulator) that have a flat frequency response to modulation are known in the art.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 1 depicts a PLL according to the prior art;

FIG. 2 depicts a conceptual model of a VCO according to the prior art;

FIG. 3 depicts PLL including the conceptual model of a VCO according to the prior art;

DETAILED DESCRIPTION OF THE INVENTION

Figure 4:
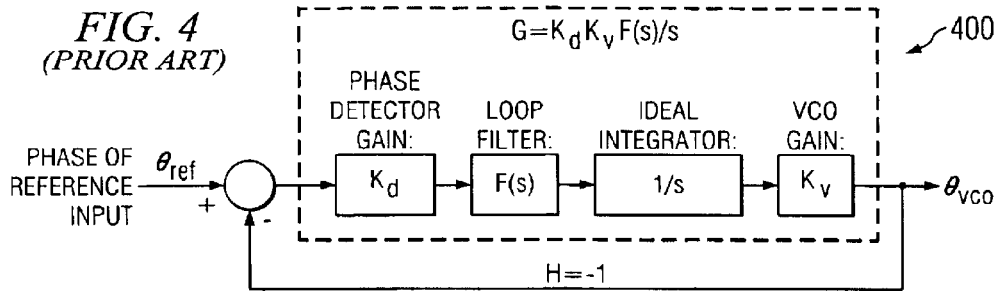
FIG. 4 depicts a mathematical model of a PLL according to the prior art.
Figure 5:
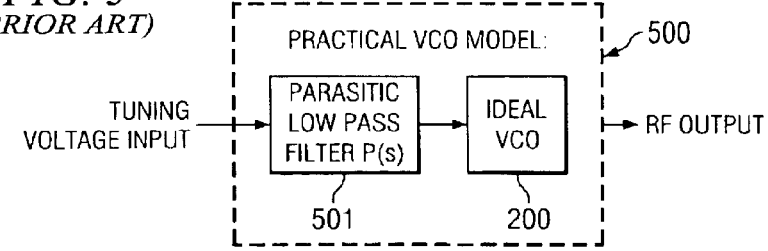
FIG. 5 depicts a practical VCO model according to the prior art.
Figure 6:
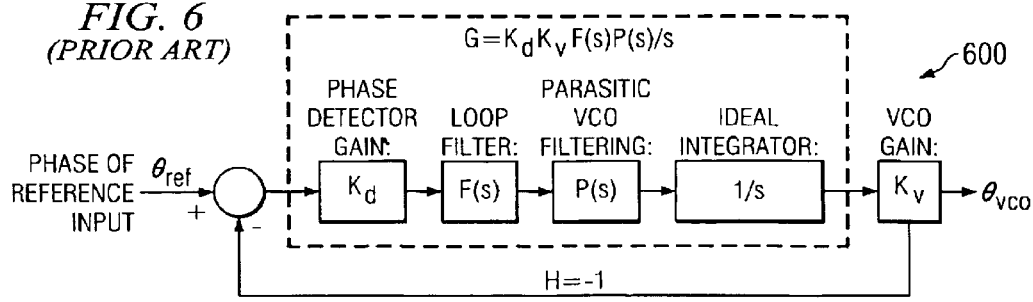
FIG. 6 depicts a mathematical model of a PLL that includes a practical VCO model according to the prior art.
Figure 7:
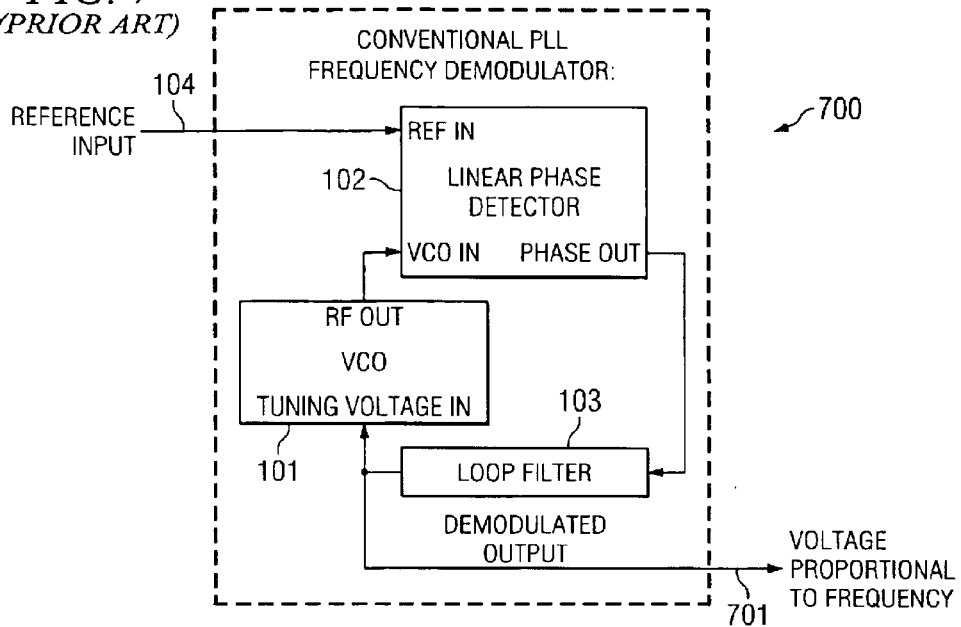
FIG. 7 depicts a conventional PLL frequency demodulator according to the prior art.
Figure 8:
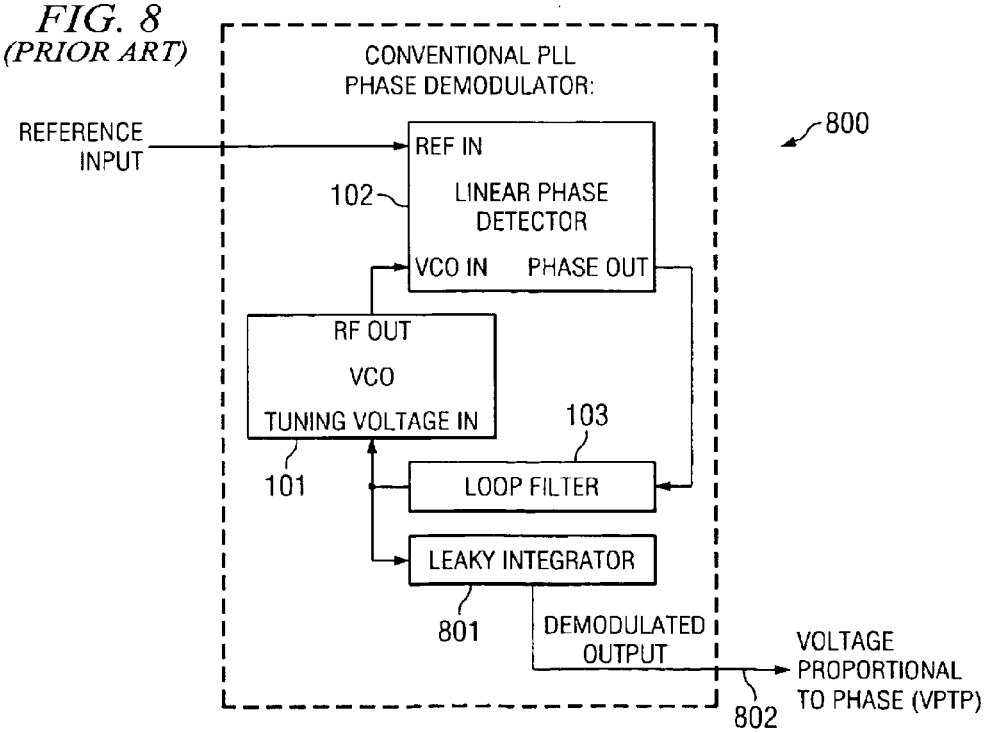
FIG. 8 depicts a conventional PLL phase demodulator according to the prior art.
Figure 9A:
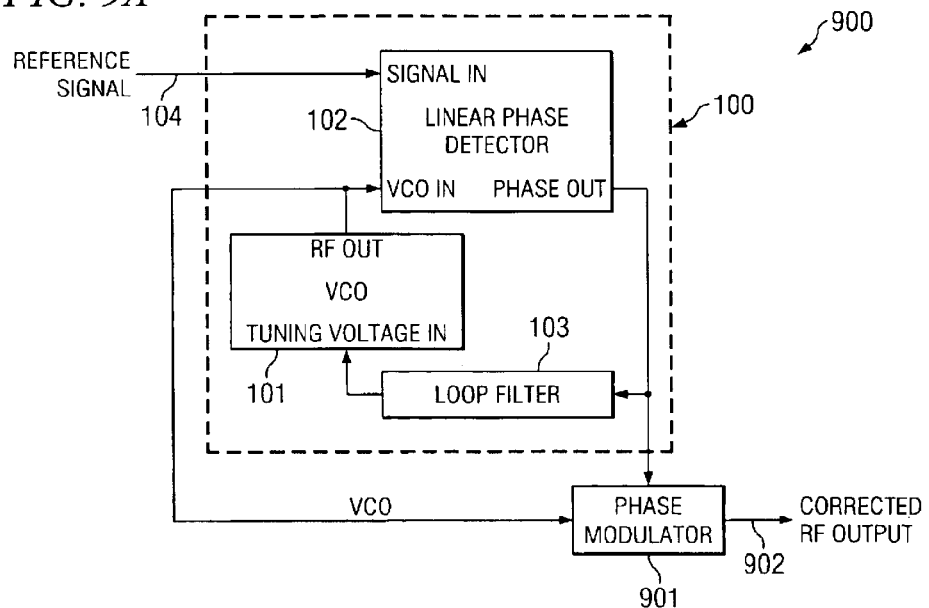
FIG. 9A depicts a PLL device according to embodiments in accordance with the invention.

FIG. 9A depicts a block diagram of PLL device 900 according to embodiments in accordance with the invention. PLL device 900 comprises traditional PLL loop 100 including VCO 101, phase detector 102, and loop filter 103. In operation, reference signal 104 is provided to one of the input ports of phase detector 102. The VCO signal from VCO 101 is provided to the other input port of phase detector 102. Phase detector 102 generates an error signal that is indicative of the phase difference between reference signal 104 and the VCO signal. The error signal is provided to loop filter 103. The filtered signal is provided to VCO 101 to tune the VCO signal. Thus, the desired feedback loop is created that causes VCO 101 to generate its VCO signal to track the phase of reference signal 104.

In operation, phase modulator 901 addresses the tracking error associated with the VCO signal. Specifically, the VCO signal is provided to phase modulator 901. Also, the error signal (which is indicative of the tracking error) is provided to phase modulator 901. The gain and polarity of phase modulator 901 may be calibrated to provide approximately equal and opposite (given the accuracy of the selected circuit element(s)) compensating phase modulation to the VCO signal. The tracking error is subtracted thereby resulting in corrected radio frequency (RF) output signal 902 that does not possess tracking error. Addressing tracking error in this manner is advantageous due to the relatively reliable characteristics of phase detector 102 and phase modulator 901.

Figure 10:
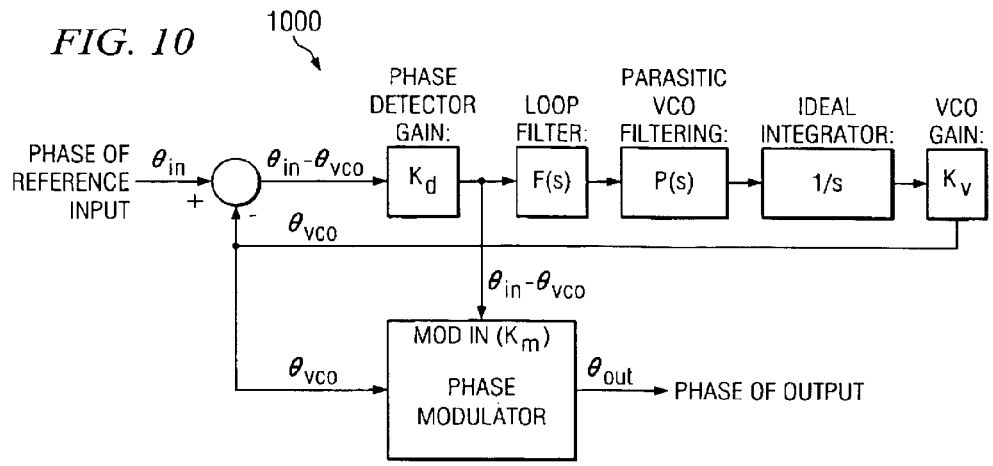
FIG. 10 depicts a mathematical analysis of the PLL devices shown in FIGS. 9A and 9B.

FIG. 10 depicts mathematical model 1000 which may be used to analyze embodiments in accordance with the invention. $\theta_{in}$ represents the phase of reference signal 104, $\theta_{vco}$ represents the phase of the signal generated by VCO 101, and $\theta_{out}$ represents the phase of corrected RF output signal 902. $K_v$ represents the gain of VCO 101, $K_d$ represents the gain of phase detector 102, and $K_m$ represents the gain of phase modulator 901. F(s) is the transfer function of loop filter 103, P(s) is the transfer function that represents the parasitic filtering of VCO 101, and 1/s represents the transfer function of ideal integrator 201. As shown in model 1000, $\theta_{out}$ equals $K_d K_m \theta_{in}$. If $K_m$ equals $1/K_d$, then $\theta_{out}$ equals $\theta_{in}$. Mathematical model 1000 assumes that the tracking error is within the dynamic range of phase detector 102 and that the dynamic range of phase modulator 901 is at least as great as that of phase detector 102. It shall be appreciated that these assumptions are relatively modest. Accordingly, the physical implementation of a device satisfying these assumptions is relatively straight-forward.

Figure 9B:
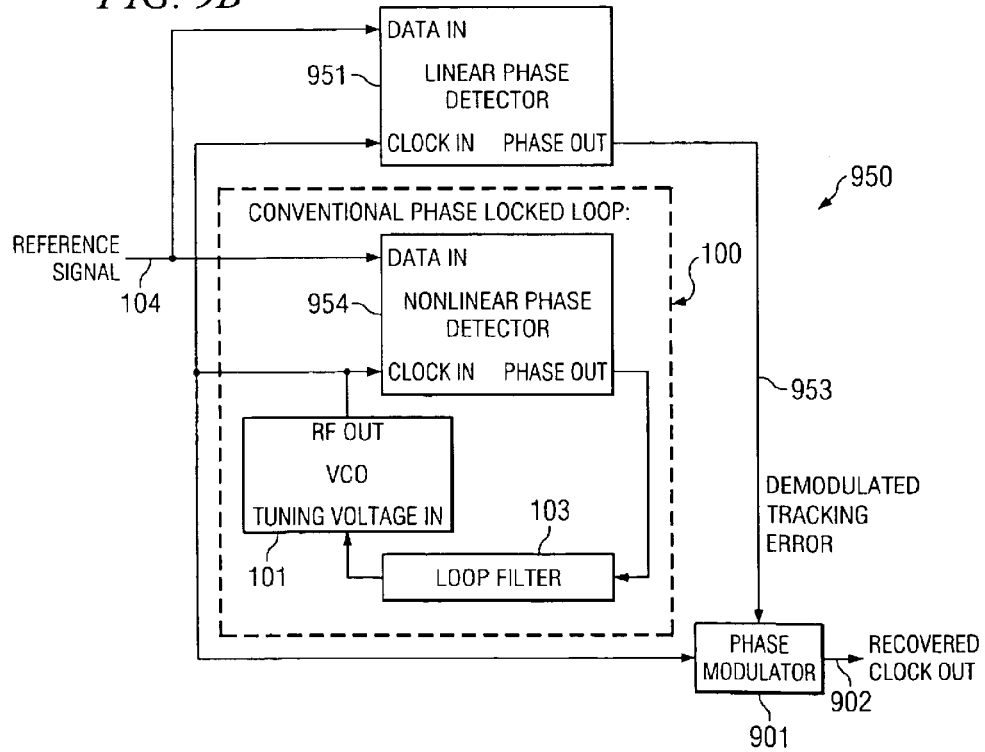
FIG. 9B depicts another PLL device according to embodiments in accordance with the invention.

Although embodiments in accordance with the invention have been described as utilizing the phase signal from the phase detector the PLL loop to perform tracking error compensation, embodiments in accordance with the invention are not so limited. Specifically, if a PLL is implemented utilizing a nonlinear phase detector that is optimized for speed or other properties, an auxiliary linear phase detector may be advantageously utilized. FIG. 9B depicts PLL device 950 that comprises linear phase detector 951 and nonlinear phase detector 954. The conventional phase lock loop of PLL device 950 includes nonlinear phase detector 954 (which may be implemented using a "bang-bang" type phase detector). Although nonlinear phase detector 954 may be optimized for other characteristics, it is not necessarily optimized for linearity and accuracy. Accordingly, embodiments in accordance with the invention may utilize auxiliary linear phase detector 951 to compare the phase of reference signal 104 with the phase of the VCO signal. The phase signal from linear phase detector 951 may then be provided to phase modulator 901 to phase modulate the VCO signal according to embodiments in accordance with the invention. It shall be appreciated that this variation may be applied to any suitable configuration of embodiments in accordance with the invention including those shown in FIGS. 11, 13, 14, 15, and 16.

Figure 11:
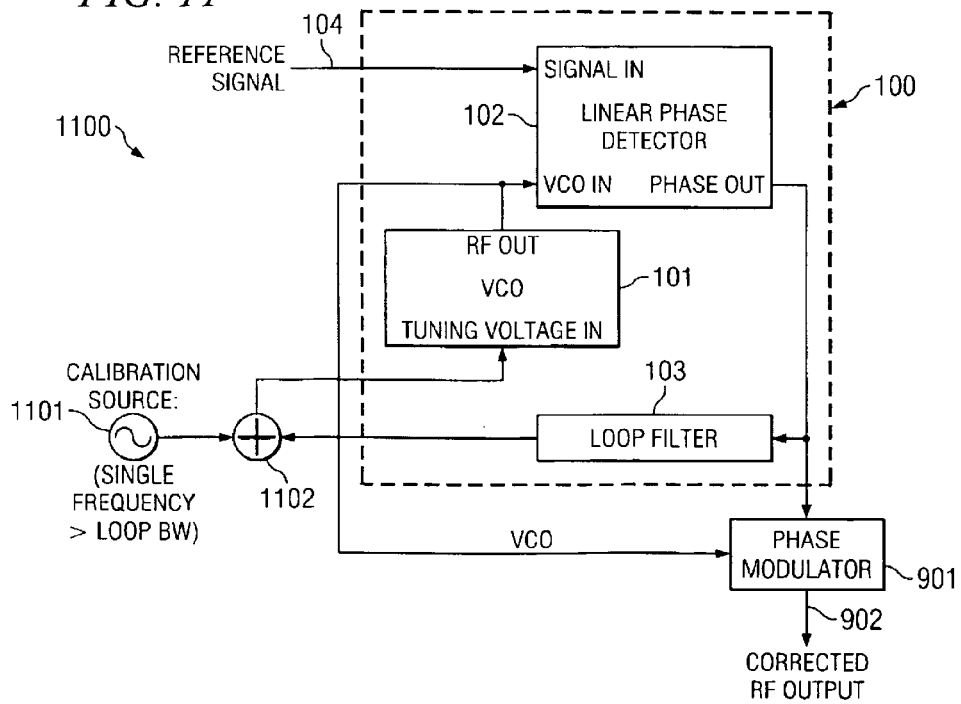
FIG. 11 depicts a PLL device adapted for calibration according to embodiments in accordance with the invention.

Furthermore, calibration of phase modulator 901 is a relatively low complexity activity. FIG. 11 depicts PLL device 1100 adapted to perform calibration of phase modulator 901 according to embodiments in accordance with the invention. PLL device 1100 is substantially similar to PLL device 900. However, PLL device 1100 further comprises calibration source 1101 and adder 1102 to facilitate calibration of phase modulator 901. An unmodulated signal source may be provided as reference signal 104. Also, source 1101 generates a signal of a single frequency that is greater than the loop bandwidth of PLL 100. The single frequency signal is added to the filtered error signal by adder 1102. The combined signal from adder 1102 is then provided to VCO 101 thereby producing tracking error. At this point, $K_m$ may be adjusted to the reciprocal of $K_d$. When properly calibrated, phase modulator 901 cancels the tracking error and the frequency component of corrected RF output signal 902 at the frequency of the calibration signal is absent.

Figure 12:
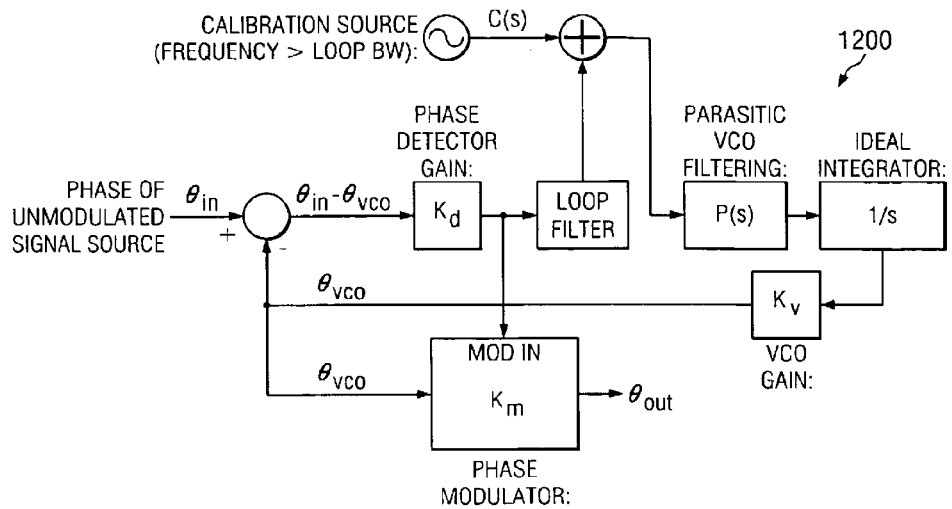
FIG. 12 depicts a mathematical analysis of calibration according to embodiments in accordance with the invention.

FIG. 12 depicts mathematical model 1200 that analyzes the calibration of PLL device 1100 according to embodiments in accordance with the invention. In model 1200, $\theta_{in}$ represents the phase of reference signal 104, $\theta_{vco}$ represents the phase of the signal generated by VCO 101, and $\theta_{out}$ represents the phase of corrected RF output signal 902. $K_v$ represents the gain of VCO 101, $K_d$ represents the gain of phase detector 102, and $K_m$ represents the gain of phase modulator 901. F(s) is the transfer function of loop filter 103, C(s) represents the single frequency signal used for calibration, P(s) is the transfer function that represents the parasitic filtering of VCO 101, and 1/s represents the transfer function of ideal integrator 201. Since reference signal 104 is an unmodulated signal, $d\theta_{in}/dt$ equals 0. When $K_m$ is calibrated to equal $K_d$, $\theta_{out}$ equals $\theta_{in}$ and $d\theta_{out}/dt$ equals $d\theta_{in}/dt$. Specifically, all of $\theta_{out}$, $\theta_{in}$, $d\theta_{out}/dt$, and $d\theta_{in}/dt$ equal zero. Thus, $K_m$ may be varied over a range of values during the calibration process, and, when $\theta_{out}$ and $d\theta_{out}/dt$ are zero, PLL device 1100 is known to be properly calibrated.

Figure 13:
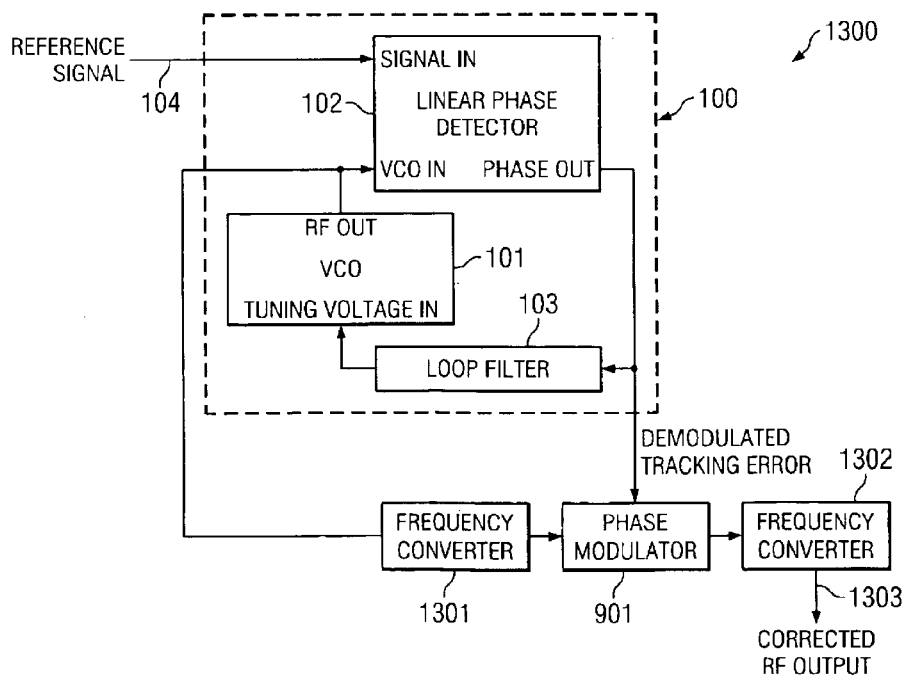
FIG. 13 depicts another PLL device according to embodiments in accordance with the invention.

FIGS. 13–16 illustrate a number of exemplary applications of PLL devices according to embodiments in accordance with the invention. In particular, FIG. 13 depicts PLL phase demodulator 1300 according to embodiments in accordance with the invention. PLL phase demodulator 1300 comprises PLL 100, frequency converter 1301, phase modulator 901, and frequency converter 1302. The error signal from phase detector 102 is provided to phase modulator 901 to modulate an input signal. In this case, instead of supplying the signal from VCO 101, the signal from VCO 101 is frequency down-shifted by frequency converter 1301 before being phase modulated by phase modulator 901. Frequency converter 1301 may be implemented as a frequency divider, multiplier, translator, or combination thereof. It may be advantageous to divide the VCO frequency by a relatively small integer to enable phase modulator 901 to operate at a lower frequency thereby reducing the complexity of phase modulator 901. Also, the required modulation index of phase modulator 901 is reduced by a factor equal to the division ratio. Frequency converter 1302 may, then, be utilized to frequency up-shift the phase modulated signal before supplying corrected RF output 1303.

Figure 14:
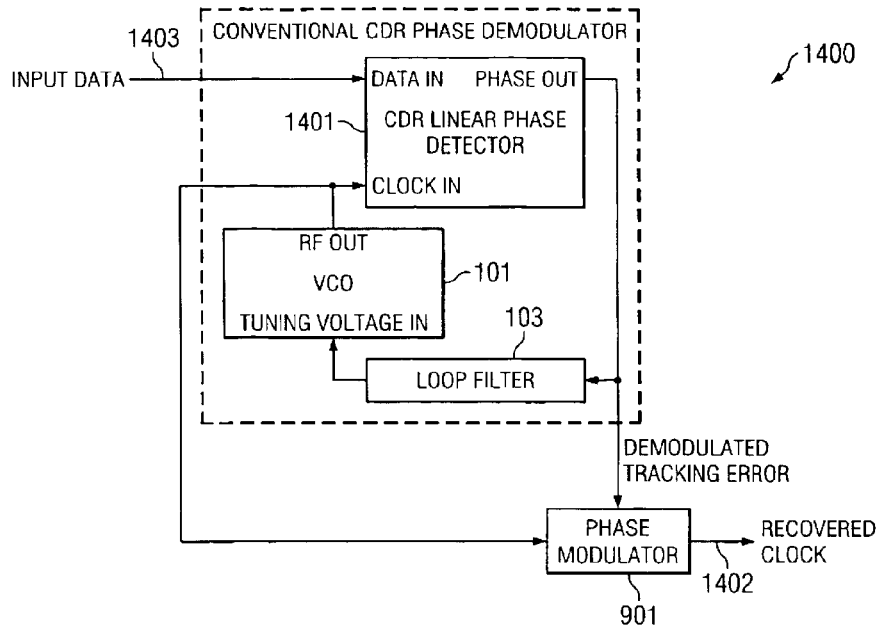
FIG. 14 depicts another PLL device according to embodiments in accordance with the invention.

FIG. 14 depicts clock/data recovery (CDR) phase demodulator 1400 according to embodiments in accordance with the invention. CDR phase demodulator 1400 is substantially similar to PLL device 1100. Data stream 1403 is transmitted without a separate clock channel. Accordingly, in this case, it is necessary to recover the clock directly from data stream 1403. To recover the clock from data stream 1403, PLL demodulator utilizes CDR phase detector 1401, which is known in the art for recovery of a clock from data stream 1403. Furthermore, the output of CDR phase detector 1401 provides its output to phase modulator 901 to modulate the signal from VCO 101. As previously noted, suitable calibration of phase modulator 901 enables CDR phase demodulator 1400 to address tracking error in a much more robust manner than known implementations. Moreover, by modulating the signal from VCO 101 in this manner, PLL demodulator 1400 provides the additional advantage of providing the recovered clock signal 1402 as a modulated RF signal and not merely as a voltage proportional to phase.

Figure 15:
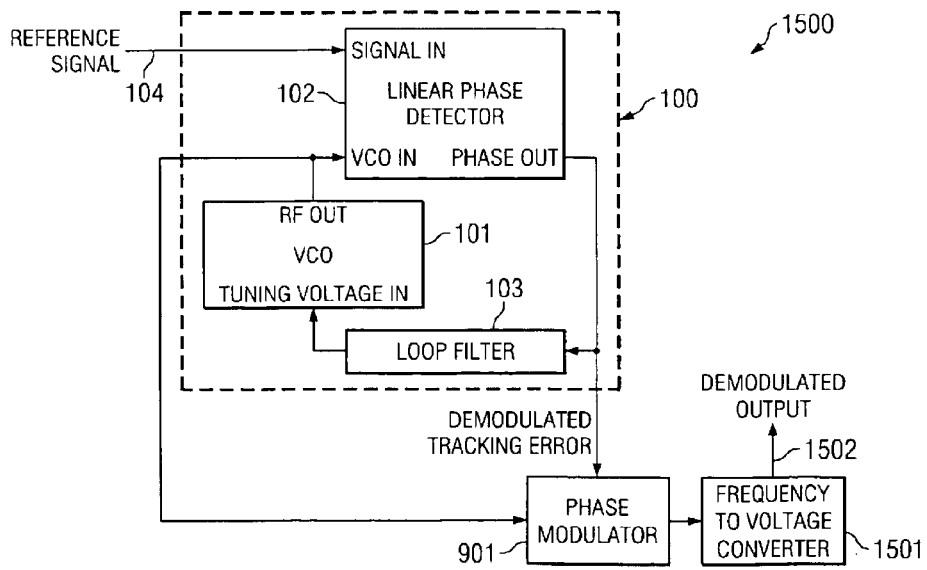
FIG. 15 depicts another PLL device according to embodiments in accordance with the invention.

FIG. 15 depicts PLL frequency demodulator 1500 that is robust against tracking error according to embodiments in accordance with the invention. PLL frequency demodulator 1500 comprises PLL 100, phase modulator 901, and frequency to voltage converter 1501. The error signal from phase detector 102 is provided to phase modulator 901 to modulate the signal from VCO 101. The output of phase modulator 901 is a signal that is locked to reference signal with minimal (if any) tracking error. The output of phase modulator 901 is provided to to generate demodulated output signal 1502. Output signal 1502 is a voltage proportional to phase of the input signal.

Figure 16:
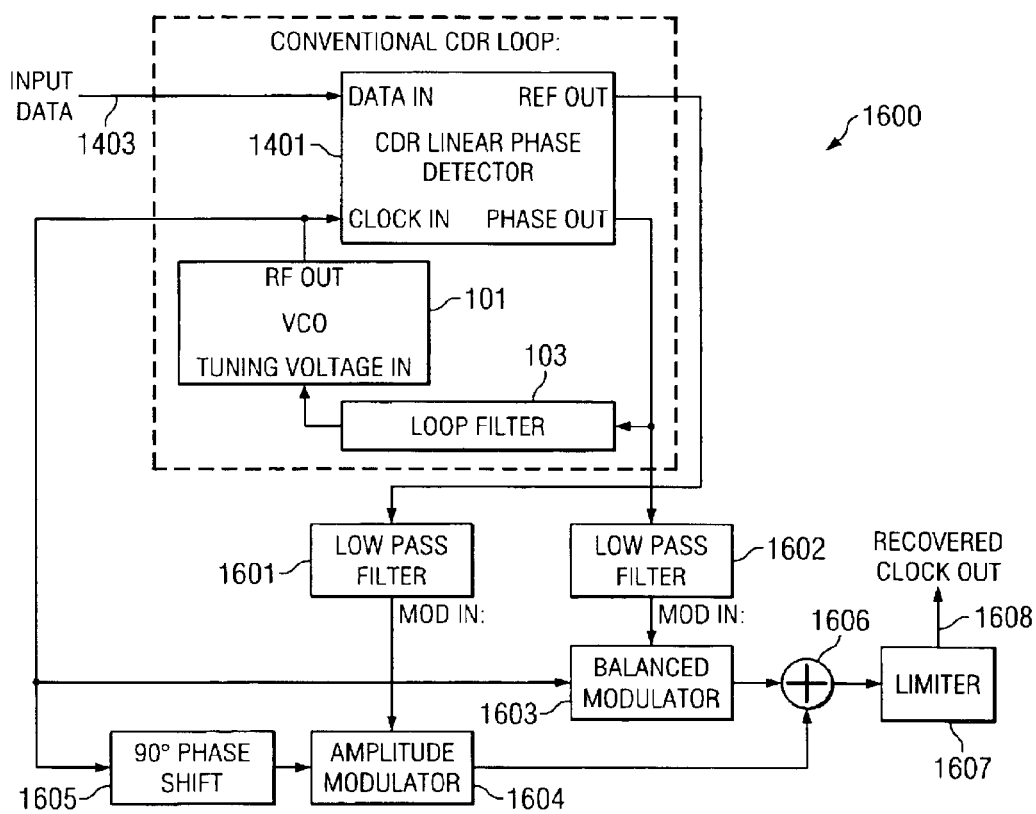
FIG. 16 depicts another PLL device according to embodiments in accordance with the invention.

FIG. 16 depicts PLL clock recovery system 1600 that is robust against tracking error according to embodiments in accordance with the invention. PLL clock recovery system 1600 comprises VCO 101, CDR phase detector 1401, loop filter 103, low pass filter 1601, low pass filter 1602, amplitude modulator 1604, 90° phase shifter 1605, balanced modulator 1603, adder 1606, and limiter 1607. There are two outputs from CDR phase detector 1401. The phase output is proportional to the product of phase and transition density. The reference output is proportional only to transition density. These outputs are provided to low-pass filters 1602 and 1601, which, in turn, provide their outputs to amplitude modulator 1604 and balanced modulator 1603 (e.g., an Armstrong modulator), respectively. Amplitude modulator 1604 modulates the signal from VCO 101 after it has been phase shifted 90°. Balanced modulator 1603 also modulates the signal from VCO 101. Tracking error associated with the PLL may be addressed by suitably calibrating balanced modulator 1603 as discussed above. The output of balanced modulator 1603 is combined with the 90° phase-shifted and amplitude-modulated version of the signal at adder 1606. The combined signal is then filtered by limiter 1607 to provide recovered clock 1608.

In addition to addressing tracking error utilizing phase modulation, PLL clock recovery system 1600 addresses the problems that arise as a result of symbol transition density variation in data stream 1403. The problems associated with such variation and systems and methods that address those problems are discussed in greater detail in the above-mentioned U.S. patent application Ser. No. 10/328,298, entitled "SYSTEMS AND METHODS FOR CORRECTING GAIN ERROR DUE TO TRANSITION DENSITY VARIATION IN CLOCK RECOVERY SYSTEMS."

Variation in the symbol or bit transition density in a data stream causes the bandwidth of known PLLs to become unpredictable and decreases the accuracy of jitter measurements according to known techniques. As shown in PLL clock recovery system 1600, the variation in symbol or bit transition density is addressed by dividing the output of low-pass filter 1602 by the output of low-pass filter 1602. Balanced modulator 1603 performs the division, in conjunction with amplitude modulator 1604, which controls the modulation sensitivity of the Armstrong phase modulation arrangement. Specifically, the division of these signals produces a phase modulated signal whose modulation index is proportional to the quotient of these two filtered signals. Performing division in the modulation domain is discussed in greater detail in the above-mentioned U.S. patent application Ser. No. 10/328,304, entitled "SYSTEM AND METHOD FOR DESIGNING AND USING ANALOG CIRCUITS OPERATING IN THE MODULATION DOMAIN."

The division of these two signals results in recovered clock that is relatively insensitive to transition density variation by suitably implementing low-pass filters 1601 and 1602. Specifically, a data stream provided to PLL clock recovery system 1600 may be communicated according to a symbol or bit unit interval and a maximum run length of consecutive symbols that occur without a transition. Low-pass filters 1601 and 1602 may be implemented to possess a bandwidth that approximately (considering aliasing effects) equals one half of the reciprocal of: said unit interval multiplied by said maximum run length. By doing so, the output of low-pass filter 1601 may considered indicative of the moving average of the number of data transitions (i.e., the symbol transition density). The output of low-pass filter 1062 may be considered indicative of the moving average of the phase error multiplied by the transition density. By dividing the output of low-pass filter 1602 by the output of low-pass filter 1601, the result is the phase error independent of the transition density.

Accordingly, PLL clock recovery system 1600 is quite advantageous, because it in relatively insensitive to tracking error and transition density variation. Thus, PLL clock recovery system 1600 is appreciably more accurate than known clock recovery designs. The improved accuracy is also enabled with a relatively low degree of complexity and implementation difficulties. Furthermore, it shall be appreciated that further variations of PLL clock recovery system 1600 may be made according to embodiments in accordance with the invention. For example, a phase demodulator may be added to PLL clock recovery system 1600 to convert the recovered clock to a phase demodulated output. Similarly, a frequency demodulator (e.g., frequency to voltage converter 1501) may be added to PLL clock recovery system 1600 in a manner analogous to PLL frequency demodulator 1500 of FIG. 15.

Embodiments in accordance with the invention enable tracking error of PLLs to be addressed in a wide variety of applications. Embodiments in accordance with the invention are further advantageous, because addressing tracking error utilizing a suitable phase modulator does not subject the error correction to a critical dependence on the characteristics of the VCO used for the application. Thus, embodiments in accordance with the invention exhibit improved performance in relation to modulation bandwidth and temperature variant environments.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device that is operable to provide a corrected phase output signal, said device comprising:

a first phase detector that generates a first phase signal;

a phase locked loop (PLL) that generates an oscillator signal that is related to a tuning signal, wherein said PLL comprises (i) a second phase detector that generates a second phase signal that is indicative of a phase difference between said oscillator signal and (ii) an input signal and a filter that filters said second phase signal to generate said tuning signal; and a phase modulator that receives said oscillator signal and said first phase signal that is indicative of a phase difference between said oscillator signal and said input signal, wherein said phase modulator generates said corrected phase output signal by adding, to said oscillator signal, an amount of phase modulation that is approximately equal and opposite to said phase difference between said oscillator signal and said input signal.

2. The device of claim 1 further comprising:
a frequency to voltage converter that generates a voltage signal in response to a frequency of said corrected phase output signal.

3. The device of claim 1 wherein first phase detector is a linear phase detector.

4. The device of claim 1 wherein said second phase detector is a nonlinear phase detector.

5. The device of claim 1 wherein said phase modulator is an Armstrong phase modulator.

6. The device of claim 1 further comprising:
a calibration source that is operable to generate a calibration signal of a frequency that is greater than a bandwidth of said PLL when said device is operated in a calibration mode; and
an adder that combines said calibration signal with said filtered phase signal to drive a voltage controlled oscillator (VCO) of said PLL during said calibration mode.

7. The device of claim 1 further comprising:
a first frequency converter that down-shifts a frequency of said oscillator signal before said oscillator signal is received by said phase modulator.

8. The device of claim 7 further comprising:
a second frequency converter that up-shifts a frequency of said corrected phase output signal.

9. A phase locked loop (PLL) device that is operable to provide a corrected phase output signal, said PLL device comprising:
a voltage controlled oscillator (VCO) that produces an oscillator signal that is related to a tuning signal;
a phase detector that generates a first phase signal from an input signal and said oscillator signal;
a phase modulator that receives said oscillator signal and said first phase signal, wherein said phase modulator generates said corrected phase output signal by adding, to said oscillator signal, an amount of phase modulation that is approximately equal and opposite to a phase difference between said input signal and said oscillator signal;
a nonlinear phase detector that generates a second phase signal; and
a filter that filters said second phase signal to generate said tuning signal.

10. The PLL device of claim 9 further comprising:
a first frequency converter that down-shifts a frequency of said oscillator signal before said oscillator signal is received by said phase modulator.

11. The PLL device of claim 10 further comprising:
a second frequency converter that up-shifts a frequency of said corrected phase output signal.

12. The PLL device of claim 9 wherein said phase detector is a linear phase detector.

13. The PLL device of claim 9 wherein said phase modulator is an Armstrong phase modulator.

14. The PLL device of claim 9 further comprising:
a calibration source that is operable to generate a calibration signal of a frequency that is greater than a PLL bandwidth of the PLL device when said PLL device is operated in a calibration mode; and
an adder that combines said calibration signal with said filtered phase signal to drive said VCO during said calibration mode.

15. The PLL device of claim 9 further comprising:
a frequency to voltage converter that generates a voltage signal in response to a frequency of said corrected phase output signal.

16. A method of providing a corrected phase output signal, comprising:
operating a phase locked loop (PLL) to provide an oscillator signal;
generating a first phase signal that is indicative of a phase difference between said oscillator signal and an input signal;
utilizing said first phase signal to phase modulate said oscillator signal by adding, to said oscillator signal, an amount of phase modulation that is approximately equal and opposite to said phase difference to generate said corrected phase output signal;
generating a second phase signal that is indicative of a phase difference between said oscillator signal and said input signal with a nonlinear phase detector;
filtering said second phase signal; and
providing said second phase signal as a tuning signal to generate said oscillator signal.

17. The method of claim 16 further comprising:
operating said PLL in a calibration mode, wherein said operating includes generating a calibration signal of a frequency that is greater than a loop bandwidth of said PLL, combining said calibration signal with a filtered phase signal of said PLL to produce a combined signal, and using said combined signal to provide a tuning signal to a voltage controlled oscillator (VCO) of said PLL.

18. The method of claim 17 further comprising:
adjusting a gain parameter of said phase modulator.

19. The method of claim 16 wherein said generating said first phase signal is performed by a clock data recovery circuit.

20. The method of claim 16 further comprising:
down-converting said oscillator signal before phase modulating said oscillator signal.

21. The method of claim 16 further comprising:
converting a frequency of said corrected phase output signal to a voltage signal.

22. The method of claim 16 wherein said generating said first phase signal is performed by a linear phase detector.

* * * * *